United States Patent
Fischer et al.

(10) Patent No.: US 6,477,099 B2
(45) Date of Patent: Nov. 5, 2002

(54) INTEGRATED CIRCUIT WITH A DIFFERENTIAL AMPLIFIER

(75) Inventors: Helmut Fischer, Taufkirchen (DE); Sebastian Kuhne, München (DE); Thoai-Thai Le, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,815

(22) Filed: Jan. 16, 2001

(65) Prior Publication Data

US 2001/0028585 A1 Oct. 11, 2001

(30) Foreign Application Priority Data

Jan. 14, 2000 (DE) .......................................... 100 01 371

(51) Int. Cl.$^7$ ................................................. G11C 7/02
(52) U.S. Cl. ........................ 365/207; 365/208; 327/52; 327/65
(58) Field of Search ................................. 365/207, 208, 365/189.01; 327/52, 65

(56) References Cited

U.S. PATENT DOCUMENTS 5,621,340 A * 4/1997 Lee et al. ...................... 327/65
5,953,276 A * 9/1999 Baker ........................... 365/208

FOREIGN PATENT DOCUMENTS

TW     83 104 409     5/1994

OTHER PUBLICATIONS

Halbleiter–Schaltungstechnik, Ulrich Tietze et al., 11$^{th}$ edition, Berlin, Springer Verlag, 1999, pp. 361, 362, 401, 402, 419.

* cited by examiner

Primary Examiner—Hoai Ho
(74) Attorney, Agent, or Firm—Laurence A. Greenberg; Werner H. Stemer; Ralph E. Locher

(57) ABSTRACT

An integrated circuit has a differential amplifier in a basic circuit having two input transistors, a load element and a power source. The power source has an N-type channel MOS transistor whose controlled path is connected to the input transistors and to a supply terminal of the power source. A control terminal of the transistor is connected to a potential that is positive with respect to a reference potential. The supply terminal of the power source is connected to a potential which is negative with respect to the reference potential and which is made available by a voltage source for switching off cell field transistors of a DRAM memory. The gate-source voltage that is increased in this way improves the behavior of the circuit with respect to fluctuations in potential and permits more favorable dimensioning of the transistor.

2 Claims, 1 Drawing Sheet

INTEGRATED CIRCUIT WITH A DIFFERENTIAL AMPLIFIER

BACKGROUND OF THE INVENTION

Field of the Invention

The present invention relates to an integrated circuit that is connected to a reference potential and has a differential amplifier with two input transistors, a load element and a power source. The input transistors are connected in parallel between the load element and the power source, and the power source has an N-type channel MOS transistor whose controlled path is connected to the input transistors and to a supply terminal of the power source. A control terminal of the MOS transistor is connected to a terminal for a potential that is positive with respect to the reference potential.

In integrated circuits, differential amplifiers are usually used in different applications. In particular, more recent generations of semiconductor memory modules have comparatively low internal supply voltages thanks to newer technologies. In such integrated circuits, differential amplifiers are used in particular for operation as input signal amplifiers, also referred to as input receivers, because they also operate as intended with comparatively low internal supply voltages.

The function of an input receiver generally relates to detecting a variable input signal and, if appropriate, amplifying it. In this respect, a differential amplifier of a basic configuration has a high input resistance, like an inverter. Differential amplifiers are used particularly in relatively new applications that have a so-called stub serial terminated logic (SSTL) interface, in particular in newer DRAM generations. Here, differential amplifiers are particularly used as so-called high-speed receivers.

The different configurations of differential amplifiers have basically the same basic circuitry of a known type. Such circuitry contains two input transistors, a power source and an active or passive load. The difference in potential of the input signals applied to the input transistors brings about a change in potential at the output of the differential amplifier. The input transistors are usually embodied using NMOS technology.

The power source of the differential amplifier is intended to have the effect of ensuring that the overall current through the two input transistors always remains constant. The power source generally used is an N-type channel MOS transistor whose drain/source path is connected to the input transistors and to a supply terminal of the power source. Because the power source of a differential amplifier particularly has the effect of a constant power source, the transistor of the power source is operated in its saturation range. So that the modulation range of the input signal is not restricted too much at one of the two input transistors, the voltage dropping across the drain/source path of the transistor should be kept as small as possible.

In order to operate the transistor in the saturation range, it is known that the condition for the voltages $$V_{DS} \geq V_{GS} - V_{TH}$$

must be fulfilled. Here, "D" stands for drain, "S" stands for source and "G" stands for gate. In previous applications, the supply terminal of the power source was usually connected to a terminal for a reference potential of the integrated circuit. Because, as described, $V_{DS}$ is relatively small, $V_{GS}$ is selected such that this voltage is insignificantly higher than the switch-on voltage $V_{TH}$. This results in particular in the problem that when there is a predefined current across the power source and a relatively low gate-source voltage a relatively large width-length ratio of the transistor has to be selected. Because, in addition, the drain-source voltage is always higher than the reference voltage of the integrated circuit, the input signal range at the input transistors is restricted in all cases. Because the transistor of the power source is operated near to its switch-on voltage, the gate-source voltage must be carefully selected. If an excessively small one, for example, is selected, the differential amplifier circuit is, in particular, sensitive to potential fluctuations of the input signals and of the supply voltage ("noise").

In the reference Tietze, Schenk,: Halbleiter-Schaltungstechnik [Semiconductor Circuit Technology], 11th edition, by Berlin et al: Springer, 1999, pages 361, 362, 401, 402, 419, various basic circuits of differential amplifiers are described. These each have two input transistors, a load element and a power source, the input transistors being connected in parallel between the load element and the power source. Furthermore, current mirrors with transistors that can be used as a power source for a differential amplifier are described. The differential amplifiers described can be operated with a positive supply voltage and a negative supply voltage.

SUMMARY OF THE INVENTION

It is accordingly an object of the invention to provide an integrated circuit with a differential amplifier that overcomes the above-mentioned disadvantages of the prior art devices of this general type, in which, on the basis of the basic circuit described, the disadvantages with regard to the dimensioning of the N-type channel MOS transistor of the power source and of the operation of the differential amplifier do not occur and in which a comparatively stable supply voltage is made available when it is used in a DRAM memory circuit.

With the foregoing and other objects in view there is provided, in accordance with the invention, a combination of an integrated dynamic memory with an integrated circuit. The integrated circuit contains a differential amplifier to be connected to a reference potential. The differential amplifier is formed of a voltage source supplying a first potential which is negative with respect to the reference potential, a load element, a power source having a supply terminal, and two input transistors connected in parallel between the load element and the power source. The power source has an N-type channel MOS transistor with a control terminal and a controlled path. The controlled path has a first end connected to the input transistors and a second end connected to the supply terminal. The control terminal of the N-type channel MOS transistor is to be connected to a terminal for a second potential that is positive with respect to the reference potential. The supply terminal of the power source is connected to the voltage source for switching off cell field transistors of the integrated dynamic memory.

The object is achieved by the integrated circuit that has the differential amplifier which is connected to the reference potential in which the differential amplifier has the two input transistors, the load element and the power source. The input transistors are connected in parallel between the load element and the power source and the power source has an N-type channel MOS transistor whose controlled path is connected to the input transistors and to a supply terminal of the power source. A control terminal of the transistor is connected to a terminal for a potential that is positive with respect to the reference potential. The integrated circuit is contained in a circuit configuration of an integrated dynamic memory, and the supply terminal of the power source is connected to a voltage source in order to switch off cell field transistors of the integrated dynamic memory. The voltage source has a potential that is negative with respect to the reference potential.

The source terminal of the transistor of the power source is therefore connected to a potential that is negative with respect to the reference potential. The result of this is that when there are supply potentials and potentials of the input signals and control signals that are otherwise unchanged, the gate-source voltage is increased. As a result, the width/length ratio of the transistor can remain relatively small for a given current across the power source. Because the transistor is also no longer operated relatively close to its switch-on voltage, the sensitivity to "noise" is reduced.

The integrated circuit according to the invention can be used in a circuit configuration of an integrated dynamic memory (DRAM). In modern DRAM circuits, a potential that is negative with respect to the reference potential is sometimes required to switch off cell field transistors. This so-called "negative wordline low voltage" (NWLV) is generally to be embodied on the semiconductor chip as a highly stable negative voltage. This advantageous property can in particular also be used for the differential amplifier by connecting the supply terminal of the power source to a voltage source in order to switch off cell field transistors of the integrated memory.

The advantageous properties of the differential amplifier according to the invention can be used, in particular, in a circuit configuration of an input receiver of the integrated circuit. To do this, a gate terminal of one of the input transistors is connected to a terminal for an input signal of the input receiver.

Other features which are considered as characteristic for the invention are set forth in the appended claims.

Although the invention is illustrated and described herein as embodied in an integrated circuit with a differential amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
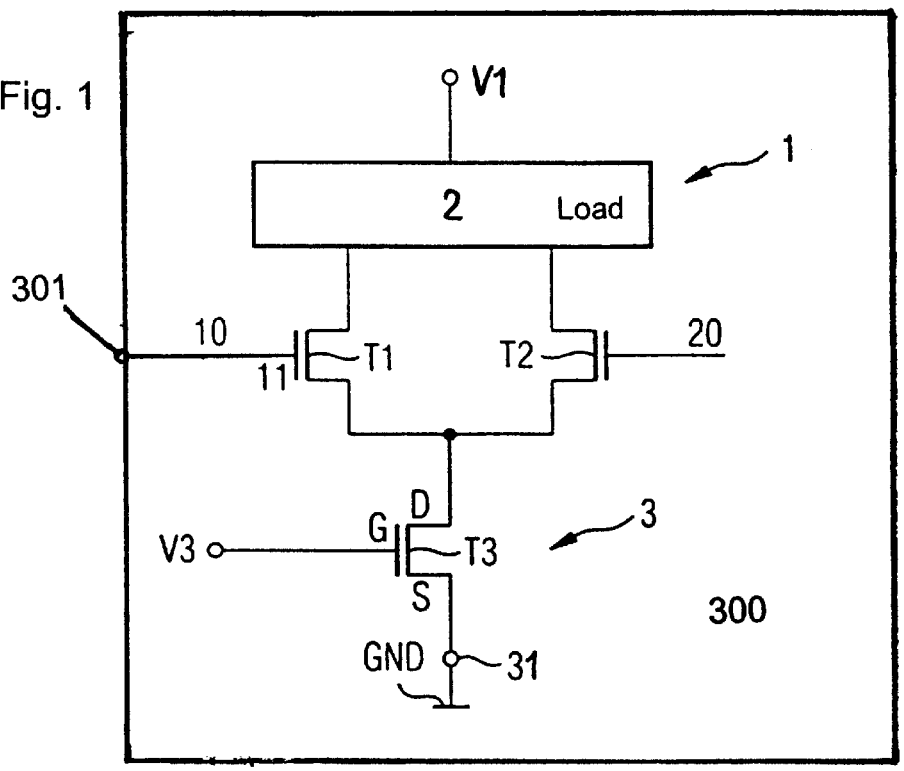
FIG. 1 is a basic circuit of a differential amplifier.

In all the figures of the drawing, sub-features and integral parts that correspond to one another bear the same reference symbol in each case. Referring now to the figures of the drawing in detail and first, particularly, to FIG. 1 thereof, there is shown a basic circuit of a differential amplifier 1 which contains input transistors T1 and T2, a power source 3 and a load element 2. The differential amplifier 1 is connected to an internal supply potential V1 by the load element 2, and to a reference potential GND of the integrated circuit by the power source 3. An input signal 10 of the differential amplifier 1 is connected to a gate terminal 11 of the input transistor T1, and, for example, a reference potential 20 is applied to a gate terminal of the input transistor T2. The input transistors T1 and T2 are connected in parallel between the load element 2 and the power source 3.

The power source 3 has a transistor T3 of the NMOS type whose drain-source path is connected to the input transistors T1 and T2 and to a supply terminal 31 of the power source 3. A control terminal G of the transistor T3 is connected to a terminal for a potential V3 which is positive with respect to the reference potential GND. The supply terminal 31 of the power source 3 is connected to a terminal for the reference potential GND.

The differential amplifier 1 can be used, in particular, in a circuit configuration of an input receiver 300. To do this, the gate terminal of the input transistor T1 is connected to an input terminal 301 of the input receiver 300 which receives an input signal.

Figure 2:
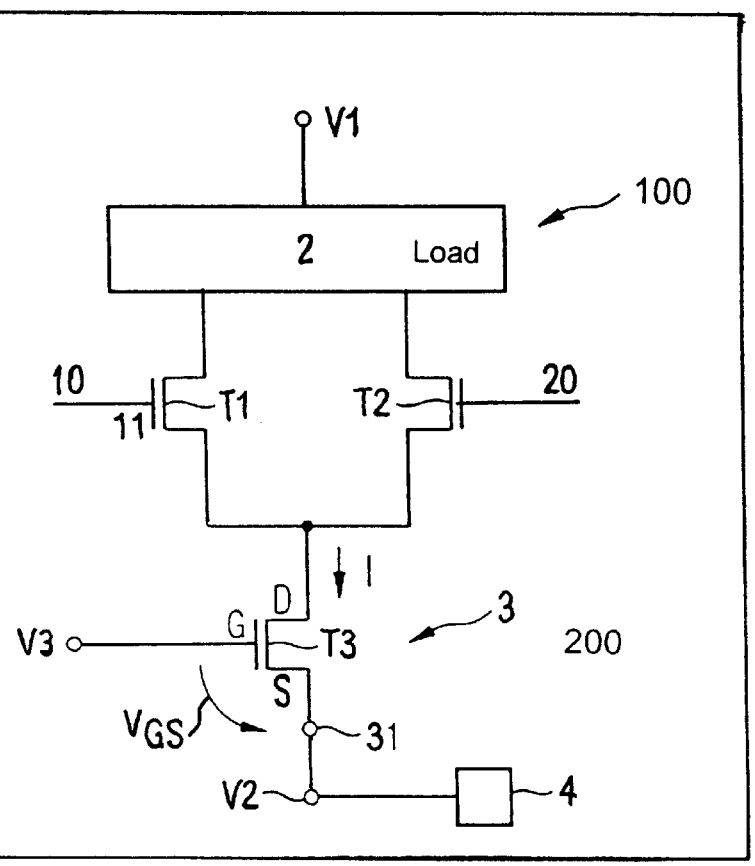
FIG. 2 is a circuit diagram of the differential amplifier according to the invention.

FIG. 2 shows a differential amplifier 100 that corresponds in its basic configuration to the differential amplifier in FIG. 1. In contrast to the latter, the supply terminal 31 of the power source 3 is connected to a terminal for a potential V2 which is negative with respect to the reference potential GND. The potentials V2 and GND are, for example, V2=−0.5 V and GND=0V. The voltage $V_{GS}$ is larger than in FIG. 1, as a result of which in comparison a smaller width/length ratio of the transistor T3 is obtained for a given current I across the power source 3. In addition, the transistor T3 is no longer operated so close to its switch-on voltage $V_{TH}$ in comparison to FIG. 1. The sensitivity to fluctuations in potential is thus reduced in the circuit according to FIG. 2 in comparison with the circuit according to FIG. 1.

The supply terminal 31 of the power source 3 is connected to a voltage source 4 for switching off cell field transistors of an integrated dynamic memory 200.

We claim:

1. In combination with an integrated dynamic memory, an integrated circuit, comprising:

a differential amplifier to be connected to a reference potential and including:
a voltage source supplying a first potential which is negative with respect to the reference potential;
a load element;
a power source having a supply terminal;
two input transistors connected in parallel between said load element and said power source;
said power source having an N-type channel MOS transistor with a control terminal and a controlled path, said controlled path having a first end connected to said input transistors and a second end connected to said supply terminal, said control terminal of said N-type channel MOS transistor to be connected to a terminal for a second potential which is positive with respect to the reference potential; and
said supply terminal of said power source connected to said voltage source for switching off cell field transistors of the integrated dynamic memory.

2. The integrated circuit according to claim 1, including an input receiver circuit having an input terminal, and said differential amplifier is contained within said input receiver circuit; and wherein said input transistors have gate terminals and said input terminal of said input receiver circuit is connected to one of said gate terminals of one of said input transistors for receiving an input signal of said input receiver circuit.

* * * * *